United States Patent
Fujisawa et al.

(10) Patent No.: US 8,552,784 B2
(45) Date of Patent: Oct. 8, 2013

(54) SEMICONDUCTOR INTEGRATED CIRCUIT FOR GENERATING CLOCK SIGNAL(S)

(75) Inventors: Toshio Fujisawa, Kanagawa (JP); Hideo Kasami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 13/235,615

(22) Filed: Sep. 19, 2011

(65) Prior Publication Data

US 2012/0235722 A1      Sep. 20, 2012

(30) Foreign Application Priority Data

Mar. 15, 2011   (JP) .................................. 2011-056890

(51) Int. Cl.
- *G06F 1/04* (2006.01)
- *H03K 3/00* (2006.01)
- *H03K 3/013* (2006.01)

(52) U.S. Cl.
USPC ............ 327/291; 327/172; 327/176; 327/299

(58) Field of Classification Search
USPC ...................... 327/172, 176, 291, 299; 326/93
See application file for complete search history.

(56) References Cited

U.S. PATENT DOCUMENTS 5,475,322 A * 12/1995 MacDonald .................... 326/93
2010/0027369 A1* 2/2010 Okuda et al. ............. 365/233.13

FOREIGN PATENT DOCUMENTS

| JP | 10-063368 | 3/1998 |
| JP | 2005-033089 | 2/2005 |

* cited by examiner

*Primary Examiner* — John Poos
(74) *Attorney, Agent, or Firm* — White & Case LLP

(57) ABSTRACT

A semiconductor integrated circuit according to an embodiment includes a clock signal generation section, a clock waveform shaping section and a plurality of function blocks. The clock signal generation section generates a clock signal of a predetermined frequency. The clock waveform shaping section generates a plurality of clock signals having the same phase as a phase of the clock signal generated by the clock signal generation section at rising edges and different phases at falling edges. Each of the plurality of function blocks has a plurality of flip flops that operate with any one of the plurality of clock signals generated by the clock waveform shaping section.

8 Claims, 7 Drawing Sheets

US 8,552,784 B2

SEMICONDUCTOR INTEGRATED CIRCUIT FOR GENERATING CLOCK SIGNAL(S)

CROSS-REFERENCE TO RELATED APPLICATION

This application is based upon and claims the benefit of priority from the prior Japanese Patent Application No. 2011-56890 filed on Mar. 15, 2011; the entire contents of which are incorporated herein by reference.

FIELD

Embodiments described herein relate generally to a semiconductor integrated circuit.

BACKGROUND

With miniaturization and improvement of performance of semiconductor integrated circuits in recent years, circuits are becoming larger in scale and faster. As a result, increases in power consumption of the semiconductor integrated circuits are becoming problematic. Such a semiconductor integrated circuit is provided with a digital region section equipped with a digital circuit and an analog region section equipped with an analog circuit, and noise caused by an increase of power consumption in the digital region section roams around the analog region section, resulting in a problem of causing malfunctions or the like.

The digital circuit of the digital region section is configured by including a plurality of flip flops and a plurality of combination circuits. Furthermore, a clock signal of a predetermined frequency is supplied to the plurality of flip flops in the digital circuit from a PLL circuit or the like and the plurality of flip flops operate based on the clock signal. Switching operation of transistors in the plurality of flip flops generates current consumption at a rising edge and a falling edge of the clock signal, and therefore power consumption increases.

Particularly, power consumption when the flip flops are operating is greater at the falling edge of the clock signal than power consumption at the rising edge.

DETAILED DESCRIPTION

A semiconductor integrated circuit according to an embodiment includes a clock signal generation section, a clock waveform shaping section and a plurality of function blocks. The clock signal generation section generates a clock signal of a predetermined frequency. The clock waveform shaping section generates a plurality of clock signals having the same phase as a phase of the clock signal generated by the clock signal generation section at rising edges and different phases at falling edges. Each of the plurality of function blocks has a plurality of flip flops that operate with any one of the plurality of clock signals generated by the clock waveform shaping section.

Hereinafter, a semiconductor integrated circuit according to embodiments of the present invention will be described in detail with reference to the accompanying drawings.

First Embodiment

First, a configuration of a semiconductor integrated circuit according to a first embodiment will be described based on FIG. 1.

Figure 1:
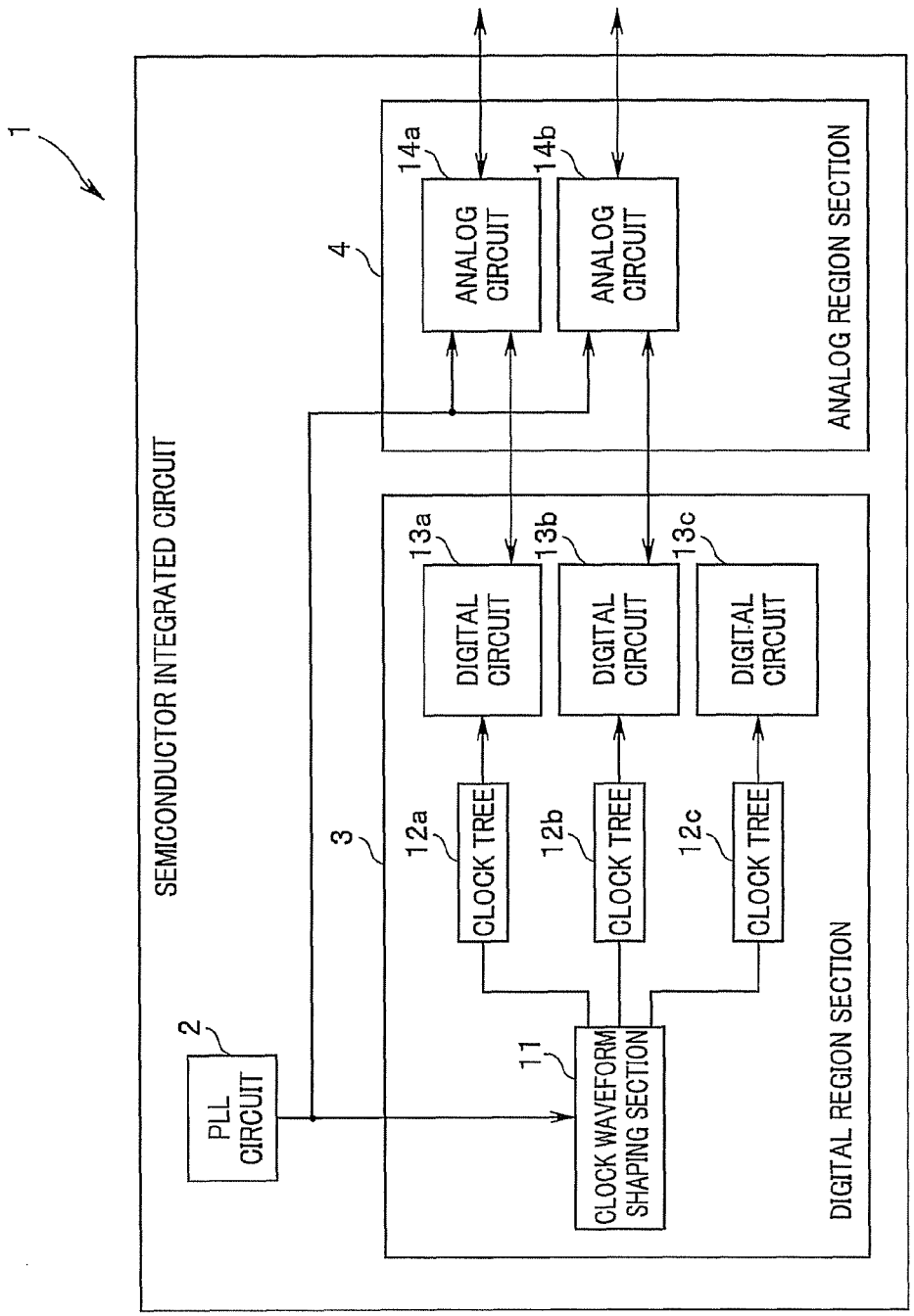
FIG. 1 is a block diagram illustrating a configuration of a semiconductor integrated circuit according to a first embodiment.

FIG. 1 is a block diagram illustrating the configuration of the semiconductor integrated circuit according to the first embodiment.

As shown in FIG. 1, a semiconductor integrated circuit 1 is configured by including a PLL circuit 2, a digital region section 3 and an analog region section 4.

The PLL circuit 2 as a clock signal generation section generates a clock signal of a predetermined frequency and supplies the clock signal to a clock waveform shaping section 11 of the digital region section 3 and analog circuits 14a and 14b of the analog region section 4, which will be described later.

The digital region section 3 is configured by including the clock waveform shaping section 11, three clock trees 12a to 12c and three digital circuits 13a to 13c connected to the clock trees 12a to 12c. The digital circuits 13a to 13c are function blocks that execute their respective predetermined functions and are configured by a plurality of flip flops and a plurality of combination circuits or the like. The digital region section 3 has the configuration having the three clock trees 12a to 12c and digital circuits 13a to 13c, but may also have a configuration including two or four or more clock trees and digital circuits.

Furthermore, the analog region section 4 is configured by including a plurality of, here two analog circuits 14a and 14b. The analog circuit 14a is, for example, an A/D converter that converts an analog signal to a digital signal and the analog circuit 14b is, for example, a D/A converter that converts a digital signal to an analog signal. The analog circuits 14a and 14b are not limited to the A/D converter and D/A converter, but may be a high frequency (RF) circuit, memory circuit or the like.

The analog circuit 14a is connected to the digital circuit 13a, converts an analog signal supplied from outside of the semiconductor integrated circuit 1 to a digital signal and outputs the digital signal to the digital circuit 13a. On the other hand, the analog circuit 14b is connected to the digital circuit 13b, converts a digital signal supplied from the digital circuit 13b to an analog signal and outputs the analog signal to outside of the semiconductor integrated circuit 1.

The clock waveform shaping section 11 generates a plurality of, here three clock signals of different duty ratios from the clock signal supplied and supplies the clock signals to the clock trees 12a to 12c. To be more specific, the clock waveform shaping section 11 generates three clock signals having the same phase at rising edges and different phases at falling edges from the supplied clock signal and supplies the clock signals to the clock trees 12a to 12c.

The clock tree 12a is made up of a plurality of clock buffers with the plurality of clock buffers being branched on a tree according to the drive capability and the number of flip flops to be driven. The clock trees 12b and 12c also have the same configuration. The clock trees 12a to 12c supply the clock signals of different duty ratios supplied from the clock waveform shaping section 11 to the digital circuits 13a to 13c.

The digital circuits 13a to 13c have a plurality of combination circuits and a plurality of flip flops or the like respectively and execute predetermined functions based on the clock signals of different duty ratios supplied from the clock trees 12a to 12c.

Here, the configuration of the clock waveform shaping section 11 that generates a plurality of clock signals of different duty ratios, or a plurality of clock signals having the same phase at rising edges and different phases at falling edges according to the present embodiment, will be described.

Figure 2:
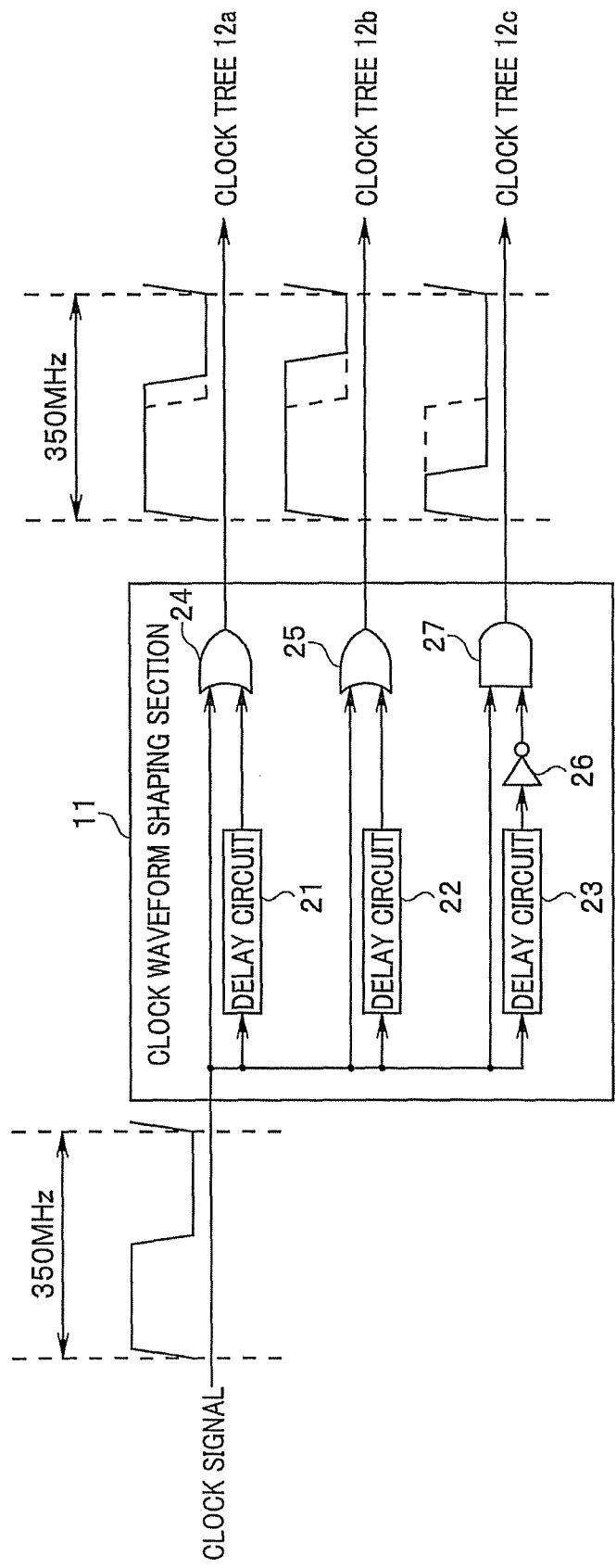
FIG. 2 is a diagram illustrating a configuration of a clock waveform shaping section.

FIG. 2 is a diagram illustrating the configuration of the clock waveform shaping section.

The clock waveform shaping section 11 is configured by including delay circuits 21, 22 and 23, OR circuits 24 and 25, an inverter circuit 26 and an AND circuit 27.

The clock signal supplied from the PLL circuit 2 is supplied to the delay circuits 21, 22 and 23. Furthermore, the clock signal supplied from the PLL circuit 2 is supplied to one terminals of the OR circuits 24 and 25, and the AND circuit 27. The delay circuits 21 to 23 have different amounts of delay and delay the supplied clock signal by a predetermined time. In the present embodiment, the delay circuit 23 has the largest delay, followed by the delay circuit 22 and the delay circuit 21 in that order.

The delay circuit 21 delays the supplied clock signal by a predetermined time and supplies the clock signal to the other terminal of the OR circuit 24. The OR circuit 24 performs an OR operation between the clock signal from the PLL circuit 2 and the clock signal delayed by a predetermined time by the delay circuit 21. Thus, a clock signal having a duty ratio of approximately 60% is outputted from the OR circuit 24 and supplied to the clock tree 12a.

The delay circuit 22 delays the supplied clock signal by a predetermined time which is longer than the predetermined time of the delay circuit 21 and outputs the delayed clock signal to the other terminal of the OR circuit 25. The OR circuit 25 performs an OR operation between the clock signal from the PLL circuit 2 and the clock signal delayed by a predetermined time which is longer than the predetermined time of the delay circuit 21 in the delay circuit 22. Thus, a clock signal having a duty ratio of approximately 70% is outputted from the OR circuit 25 and supplied to the clock tree 12b.

The delay circuit 23 delays the supplied clock signal by a predetermined time which is longer than the predetermined time of the delay circuit 22 and outputs the delayed clock signal to the inverter circuit 26. The inverter circuit 26 inverts the signal from the delay circuit 23 and outputs the inverted signal to the other terminal of the AND circuit 27. The AND circuit 27 performs an AND operation between the clock signal from the PLL circuit 2, and the clock signal delayed by a predetermined time which is longer than the predetermined time of the delay circuit 22 by the delay circuit 23 and inverted by the inverter circuit 26. Thus, a clock signal having a duty ratio of approximately 30% is outputted from the AND circuit 27 and supplied to the clock tree 12c.

Thus, the clock waveform shaping section 11 generates three clock signals having the same phase at rising edges and different phases at falling edges through the delay circuits 21 to 23 and logic gates, to be more specific, a combination circuit made up of the delay circuit 21 and the OR circuit 24, a combination circuit made up of the delay circuit 22 and the OR circuit 25 and a combination circuit made up of the delay circuit 23, the inverter circuit 26 and the AND circuit 27.

Next, power consumption of the semiconductor integrated circuit 1 having such a configuration will be described. In the semiconductor integrated circuit 1, power consumption of the flip flops of the digital circuits 13a to 13c increases as the circuit scale increases. Hereinafter, the circuit configuration of the flip flop will be described.

Figure 3:
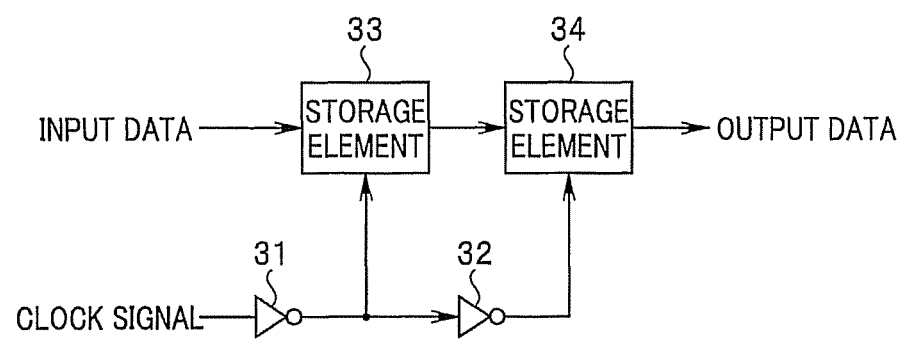
FIG. 3 is a diagram illustrating an example of flip flop circuit configuration.

FIG. 3 is a diagram illustrating an example of the flip flop circuit configuration.

As shown in FIG. 3, the flip flop is configured by including inverter circuits 31 and 32 and storage elements 33 and 34.

The first-stage inverter circuit 31 receives a clock signal as input. The inverter circuit 31 inverts the inputted clock signal and supplies the inverted clock signal to the inverter circuit 32 and the storage element 33. The second-stage inverter circuit 32 inverts the clock signal from the inverter circuit 31 and supplies the inverted clock signal to the storage element 34. The storage elements 33 and 34 incorporate and store the input data based on the clock signals from the inverter circuits 31 and 32.

In the flip flop having such a configuration, current consumption caused by the switching operations of transistors of the inverter circuits 31 and 32 becomes problematic.

Figure 4:
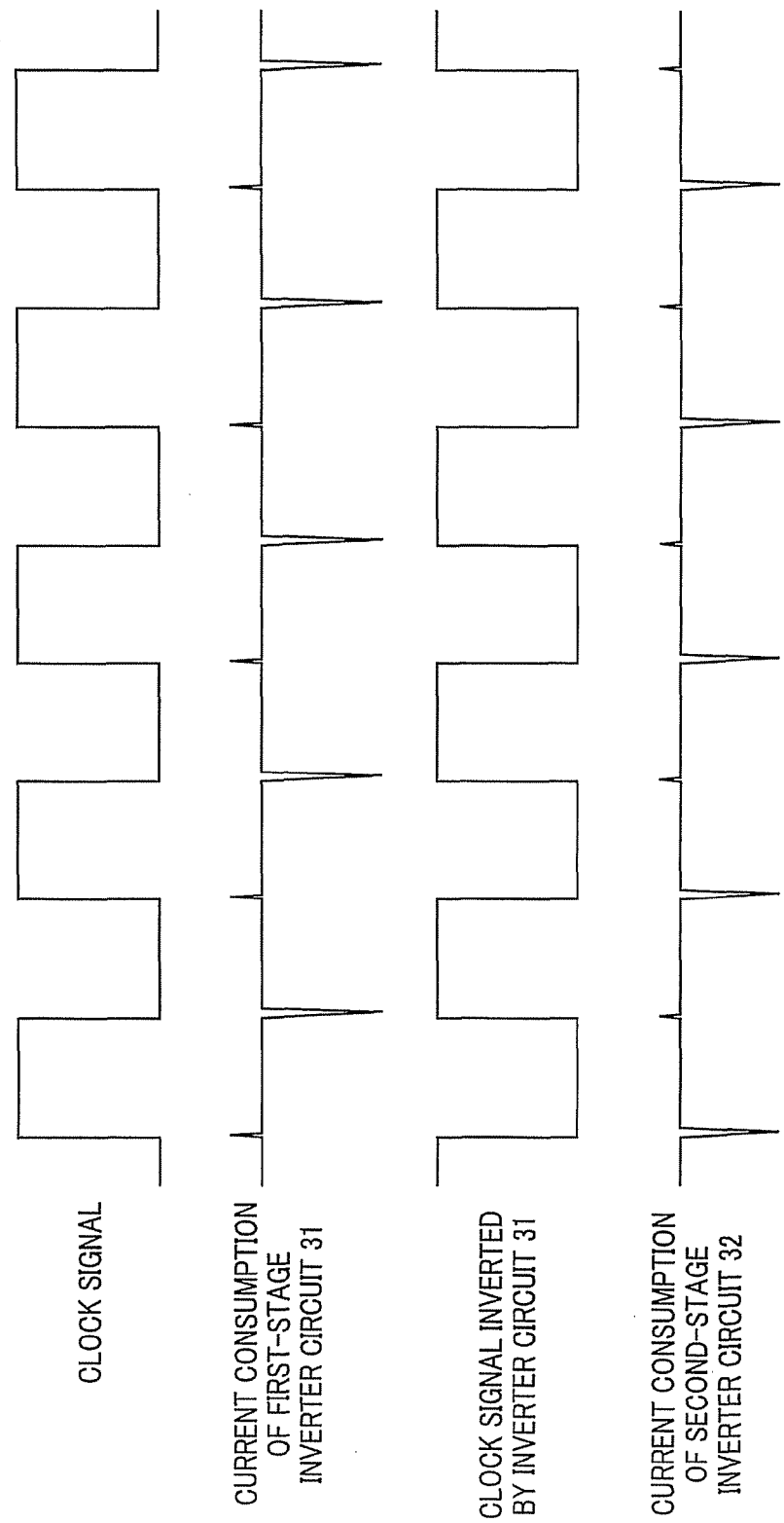
FIG. 4 is a diagram illustrating current consumption generated in an inverter circuit in the flip flop.

FIG. 4 is a diagram illustrating current consumption generated in the inverter circuit in the flip flop. Here, the amount of current pulled in by the inverter circuit from a power supply is expressed by a downward, that is, negative value.

As shown in FIG. 4, the current consumed at falling edges of the clock signal is dominant in the first-stage inverter circuit 31. This is because when the value of the clock changes from 1 to 0, a p-channel transistor turns from OFF to ON, draws the current from the power supply and charges the input of the next-stage inverter circuit. On the other hand, the clock signal inverted by the inverter circuit 31 is supplied to the second-stage inverter circuit 32, and therefore the rising edge of the clock signal becomes a falling edge in the second-stage inverter circuit 32. Therefore, as shown in FIG. 4, the current consumed at the rising edge of the clock signal is dominant in the second-stage inverter circuit 32.

Here, when a maximum value of the current consumed by the first-stage inverter is compared with the maximum value of the current consumed by the second-stage inverter, current consumption in the first-stage is greater. This is attributable to the fact that the output load capacity of the first-stage inverter is greater than the output load capacity of the second-stage inverter by the amount of the input load capacity of the second-stage inverter. Therefore, when power consumption including the two inverters is observed, the current consumed at the falling edge of the clock is greater than the current consumed at the rising edge of the clock.

Figure 5:
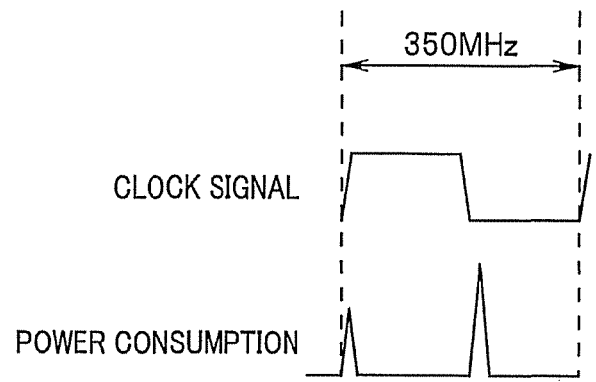
FIG. 5 is a diagram illustrating power consumption when the flip flop is operated with a single clock signal.

FIG. 5 is a diagram illustrating power consumption when the flip flop is operated with a single clock signal.

FIG. 5 shows power consumption generated when all the flip flops in the digital circuits 13a to 13c are operated with a single clock signal. In all the flip flops in the digital circuits 13a to 13c, power consumption generated at the falling edge of the clock signal is greater than power consumption generated at the rising edge based on the relationship in FIG. 4.

Figure 6:
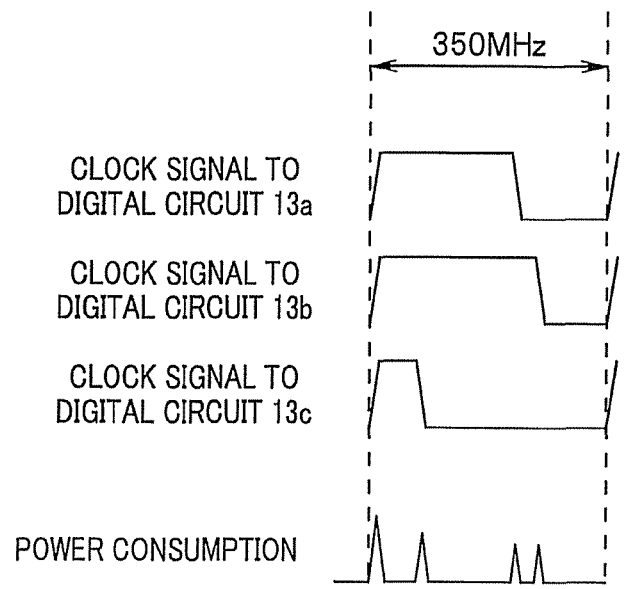
FIG. 6 is a diagram illustrating power consumption when the flip flop is operated with clock signals having different duty ratios.

FIG. 6 is a diagram illustrating power consumption when the flip flops are operated with clock signals of different duty ratios.

In the present embodiment, as shown in FIG. 6, the clock waveform shaping section 11 generates three clock signals having the same phase at rising edges and different phases at falling edges. The flip flops in the digital circuits 13a to 13c are operated by these three clock signals having different phases at the falling edges. Thus, power consumption generated at the falling edges is distributed and power consumption generated at the falling edges of three clock signals of different duty ratios is smaller than power consumption generated at the falling edge of a single clock signal.

As described above, the semiconductor integrated circuit 1 causes the clock waveform shaping section 11 to generate a plurality of clock signals having the same phase of the clock signals at the rising edges and different phases at the falling edges to operate the digital circuits 13a to 13c. This allows the semiconductor integrated circuit 1 to distribute power consumption generated at the falling edges.

Thus, according to the semiconductor integrated circuit of the present embodiment, power consumption generated at the falling edges of the clock signals can be reduced.

Furthermore, by reducing power consumption at the falling edges of the clock signals and suppressing a supply voltage variation (IR drop), it is possible to reduce the amount of noise or the like produced in the digital region section 3 that roams around the analog region section 4. Furthermore, by suppressing the supply voltage variation, it is possible to reduce the thickness of the power line and reduce the interval of the power line, and thereby reduce the number of power supply pins and reduce the size of the package. Furthermore, since the phase at the rising edges of the clock signals is the same as the conventional phase, influences on the timing design can be reduced.

Second Embodiment

Next, a second embodiment will be described.

A semiconductor integrated circuit 1a of the second embodiment is configured using a clock waveform shaping section 11a instead of the clock waveform shaping section 11 in FIG. 1. Hereinafter, the configuration of the clock waveform shaping section 11a will be described using FIG. 7.

Figure 7:
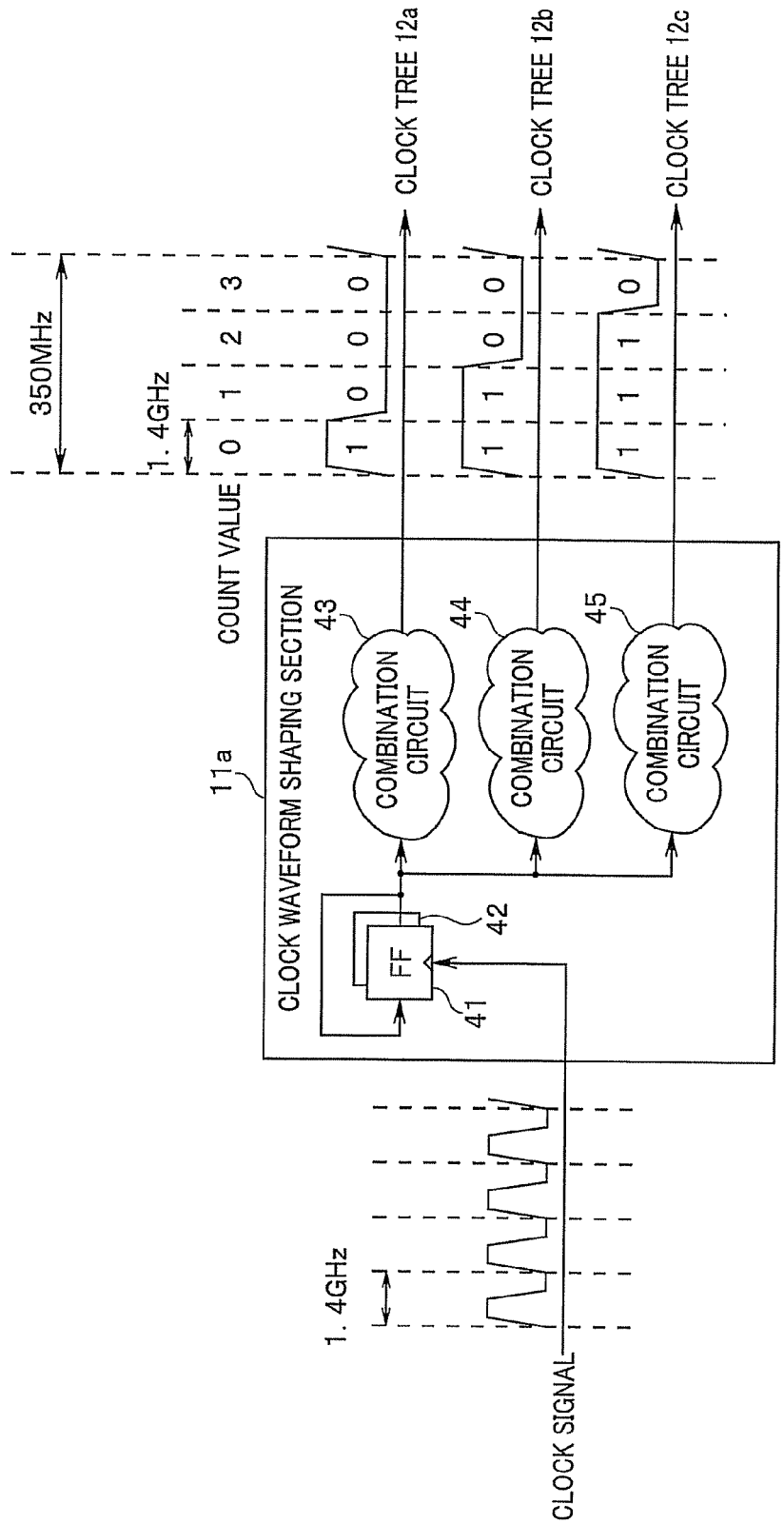
FIG. 7 is a diagram illustrating a configuration of a clock waveform shaping section according to a second embodiment.

FIG. 7 is a diagram illustrating a configuration of the clock waveform shaping section according to the second embodiment.

As shown in FIG. 7, the clock waveform shaping section 11a is configured by including a plurality of, here two flip flops 41 and 42 operating at a frequency of 1.4 GHz and a plurality of, here three combination circuits 43 to 45.

In the present embodiment, the PLL circuit 2 outputs a clock signal of a higher frequency than the operating frequency of the flip flops of the digital circuits 13a to 13c. To be more specific, the PLL circuit 2 outputs a clock signal of 1.4 GHz, four times faster than 350 MHz which is an operating frequency of the flip flops of the digital circuits 13a to 13c. The clock signal is supplied to the flip flops 41 and 42 of the clock waveform shaping section 11a.

The flip flops 41 and 42 make up a 2-bit counter, count up at the rising edge of a clock signal and sequentially output 0 to 3 as count values. The count values are supplied to the combination circuits 43 to 45. To make up the 2-bit counter, the clock waveform shaping section 11a has a configuration including the two flip flops 41 and 42, but may also have a configuration including three or more flip flops to make up a counter with 3 or more bits.

The combination circuits 43 to 45 are circuits configured to output specific values to the clock trees 12a to 12c according to the supplied count value. For example, the combination circuit 43 outputs 1 when the count value is 0 and outputs 0 when the count value is 1 to 3 to the clock tree 12a. Furthermore, the combination circuit 44 outputs 1 when the count value is 0 and 1, and outputs 0 when the count value is 2 and 3 to the clock tree 12b. Furthermore, the combination circuit 45 outputs 1 when the count value is 0 to 2, and outputs 0 when the count value is 3 to the clock tree 12c.

Thus, the clock waveform shaping section 11a of the semiconductor integrated circuit 1a causes the flip flops 41 and 42, and the combination circuits 43 to 45 making up a counter to generate three clock signals having the same phase at the rising edges and different phases at the falling edges. As a result, according to the semiconductor integrated circuit 1a of the present embodiment, it is possible to reduce power consumption generated at the falling edges of the clock signals as in the case of the first embodiment.

Flip flops operating at 1.4 GHz may also be provided at the output stages of the combination circuits 43 to 45. By providing these flip flops, the clock waveform shaping section 11a can output good-looking clock signals free of whisker-shaped noise.

Third Embodiment

Next, a third embodiment will be described.

A semiconductor integrated circuit 1b according to the third embodiment is configured using a clock waveform shaping section 11b instead of the clock waveform shaping section 11 in FIG. 1. Furthermore, the semiconductor integrated circuit 1b according to the third embodiment is configured by removing the clock trees 12a to 12c in FIG. 1. Hereinafter, the configuration of the clock waveform shaping section 11b will be described using FIG. 8.

Figure 8:
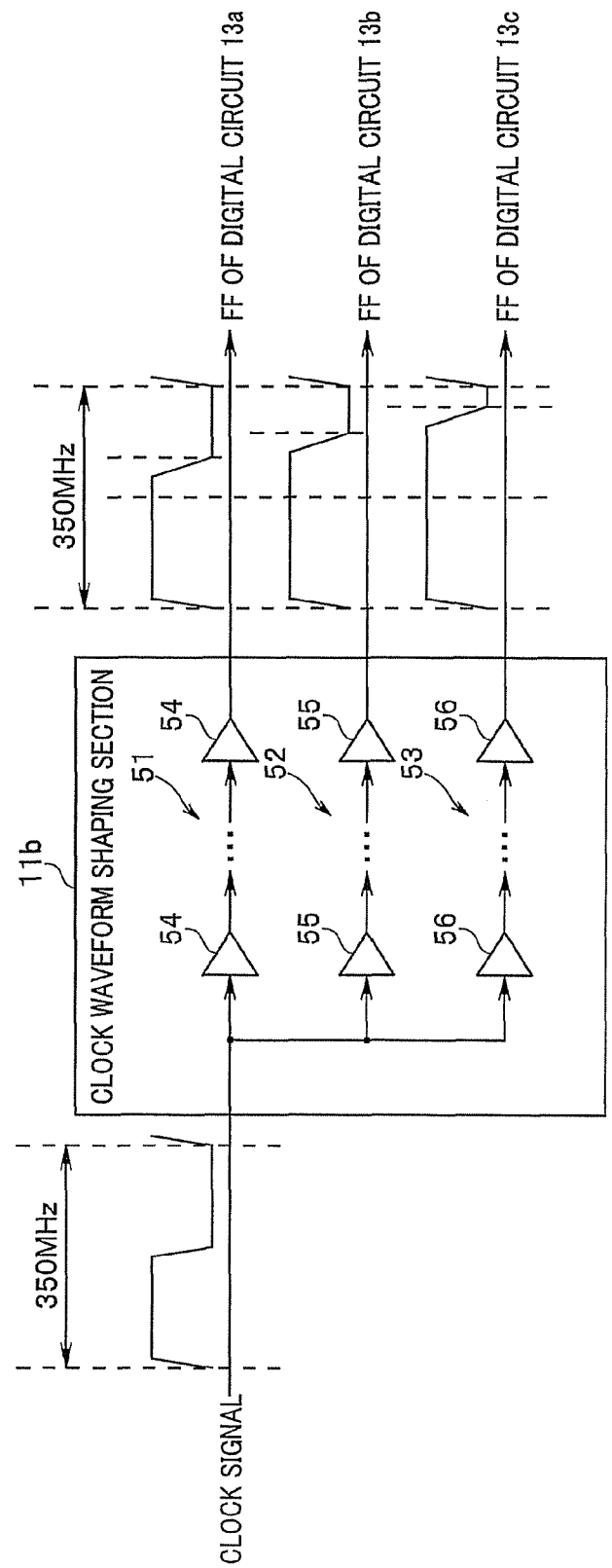
FIG. 8 is a diagram illustrating a configuration of a clock waveform shaping section according to a third embodiment.

FIG. 8 is a diagram illustrating the configuration of the clock waveform shaping section according to the third embodiment.

As shown in FIG. 8, the clock waveform shaping section 11b is configured by including clock trees 51 to 53. The clock tree 51 includes a plurality of clock buffers 54 in which a rising transition time is different from a falling transition time. Furthermore, the clock tree 52 includes a plurality of clock buffers 55 in which a falling transition time is different from the falling transition time of the clock buffers 54. Furthermore, the clock tree 53 includes a plurality of clock buffers 56 in which a falling transition time is different from the falling transition times of the clock buffers 54 and 55.

A clock signal supplied to the clock waveform shaping section 11b is supplied to these clock trees 51 to 53. The clock signals supplied to the clock trees 51 to 53 propagate through the plurality of clock buffers 54 to 56, and clock signals having the same phase at the rising edges and different phases at the falling edges are thereby outputted.

The clock signal outputted from the clock tree 51 is supplied to the flip flop of the digital circuit 13a. Similarly, the clock signal outputted from the clock tree 52 is supplied to the flip flop of the digital circuit 13b and the clock signal outputted from the clock tree 53 is supplied to the flip flop of the digital circuit 13c.

The clock trees 51, 52 and 53 in the present embodiment use the clock buffers in which an H period of a clock signal extends, but clock buffers in which an L period of a clock signal extends may also be used. Furthermore, these clock buffers may be combined so that, for example, the clock trees 51 and 52 may use clock buffers in which an H period of a clock signal extends, and the clock tree 53 may use a clock buffer in which an L period of a clock signal extends.

Thus, the clock waveform shaping section 11b of the semiconductor integrated circuit 1b causes the clock trees 51 to 53 provided with a plurality of clock buffers having different falling transition times to generate three clock signals having different phases at the falling edges. As a result, according to the semiconductor integrated circuit 1b of the present embodiment, it is possible to reduce power consumption generated at the falling edges of clock signals as in the case of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a clock signal generation section configured to generate a clock signal of a predetermined frequency;
   a clock waveform shaping section configured to generate a plurality of clock signals having the same phase as a phase of the clock signal generated by the clock signal generation section at rising edges and different phases at falling edges; and
   a plurality of function blocks having a plurality of flip flops configured to operate with anyone of the plurality of clock signals generated by the clock waveform shaping section,
   wherein the clock waveform shaping section comprises a counter configured to count up at rising edges of the clock signal and a plurality of combination circuits configured to output a specific value according to a count value counted by the counter.

2. The semiconductor integrated circuit according to claim 1, wherein the clock waveform shaping section comprises a plurality of delay circuits configured to delay the clock signal by different amounts of delay and a logic gate configured to perform logic operation between the plurality of clock signals delayed by the plurality of delay circuits and the clock signal.

3. The semiconductor integrated circuit according to claim 2, wherein the logic gate is made up of an OR circuit configured to perform an OR operation between the delayed clock signals and the clock signal.

4. The semiconductor integrated circuit according to claim 2, wherein the logic gate comprises an inverter circuit configured to invert the delayed clock signals and an AND circuit configured to perform an AND operation between the clock signals inverted by the inverter circuit and the clock signal.

5. The semiconductor integrated circuit according to claim 1, wherein the counter comprises a plurality of flip flops.

6. The semiconductor integrated circuit according to claim 1, wherein the clock waveform shaping section comprises a plurality of clock trees having a plurality of clock buffers in which a rising transition time is different from a falling transition time.

7. The semiconductor integrated circuit according to claim 6, wherein the plurality of clock buffers extend an H period of the clock signal or an L period of the clock signal.

8. The semiconductor integrated circuit according to claim 1, further comprising a plurality of analog circuits configured to operate with the clock signal and connected to the plurality of function blocks respectively.

\* \* \* \* \*